United States Patent
Kneller et al.

(10) Patent No.: US 12,058,836 B2
(45) Date of Patent: Aug. 6, 2024

(54) FAN CONTROLLER

(71) Applicant: TDK-LAMBDA UK LIMITED, Ilfracombe (GB)

(72) Inventors: Quinn Kneller, Ilfracombe (GB); Mark Saintey, Ilfracombe (GB)

(73) Assignee: TDK-Lambda UK Limited, Devon (GB)

( * ) Notice: Subject to any disclaimer, the term of this patent is extended or adjusted under 35 U.S.C. 154(b) by 43 days.

(21) Appl. No.: 17/324,534

(22) Filed: May 19, 2021

(65) Prior Publication Data

US 2021/0368649 A1    Nov. 25, 2021

(30) Foreign Application Priority Data

May 21, 2020    (GB) ..................... 2007608

(51) Int. Cl.
*H05K 7/20*    (2006.01)
*G01K 7/34*    (2006.01)
(Continued)

(52) U.S. Cl.
CPC ......... *H05K 7/20209* (2013.01); *G01K 7/346* (2013.01); *H02P 6/085* (2013.01);
(Continued)

(58) Field of Classification Search
CPC .... H05K 7/20209; G01K 7/346; H02P 6/085; H02P 7/2805; H02P 29/68; F05D 2270/303; F04D 27/004
See application file for complete search history.

(56) References Cited

U.S. PATENT DOCUMENTS 4,494,526 A * 1/1985 Wurst ................ G05D 23/1924
                                                      126/585
4,907,737 A * 3/1990 Williams, Jr. .......... F23N 5/203
                                                      110/162
(Continued)

FOREIGN PATENT DOCUMENTS

GB    2301489 A    12/1996
GB    2518863 A    4/2015

OTHER PUBLICATIONS

UK Intellectual Property Office, Search Report under Section 17, Patent Application No. GB2007608.9, Nov. 26, 2020.
(Continued)

*Primary Examiner* — Bickey Dhakal
(74) *Attorney, Agent, or Firm* — Gurr Brande & Spendlove, PLLC; Robert D. Spendlove

(57) ABSTRACT

Fan controller (1) for a modular power supply having a fan (13). An output (8) is provided for transmitting control signals to the fan (13) for controlling fan speed. A plurality of sensor modules (20) are associated with a respective module (11, 6, 7) of the modular power supply. Each sensor module (20) includes a temperature detecting circuit comprising a sensor for sensing temperature variations in the respective module (11, 6, 7), a fan control circuit (30) galvanically isolated from the temperature detecting circuit for outputting a control signal to the output (8) for controlling the fan (13), and an optocoupler (10,9) for transferring an output signal from the temperature detecting circuit (20) to the fan control circuit (30) for generating the control signal.

15 Claims, 2 Drawing Sheets

(51) Int. Cl.
  *H02P 6/08* (2016.01)
  *H02P 7/28* (2016.01)
  *H02P 29/68* (2016.01)
(52) U.S. Cl.
  CPC ............ *H02P 7/2805* (2013.01); *H02P 29/68* (2016.02); *H05K 7/20909* (2013.01)

(56) References Cited

U.S. PATENT DOCUMENTS

| | | | | |
|---|---|---|---|---|
| 7,659,678 | B2* | 2/2010 | Maiocchi | H02M 3/1588 |
| | | | | 318/400.23 |
| 8,387,890 | B2* | 3/2013 | Crocker | G01K 7/42 |
| | | | | 236/1 C |
| 2002/0126431 | A1* | 9/2002 | Yanagisawa | G06F 1/1632 |
| | | | | 361/103 |
| 2009/0167228 | A1* | 7/2009 | Chung | F04D 27/004 |
| | | | | 318/473 |
| 2010/0084543 | A1 | 4/2010 | Hou | |
| 2014/0028236 | A1* | 1/2014 | Suzuki | H02P 6/182 |
| | | | | 318/503 |
| 2015/0237765 | A1 | 8/2015 | Liu | |

OTHER PUBLICATIONS

"Keysight Technologies N6700 Modular Power System Family"; by Keysight Technologies; Published Dec. 1, 2017; 20 Pages.
"Innovating Reliable Power"; by TDK-Lambda; 6 Pages (Undated).
"Modular, Configurable Power Supplies Accelerate System Design"; by Excelsys Technologies; Posted on Sep. 29, 2015; 11 Pages.
"Ultimod Series Modular Power Supplies with High Efficiency and High Reliability"; by Advanced Energy; https://www.advancedenergy.com/en-US/products/ac-dc-power-supply-units/configurable-modular-psus/ultimod/#technical-documentation; 2 Pages.
"Ultimod Unique in Flexibility, Unrivalled in Performance, Ultra-Cost Competitive"; by Advanced Energy; Dated 2019; 8 Pages.
"TDK-Lambda's Modular Story"; by TDK-Lambda; Dated Nov. 2022; 2 Pages.

* cited by examiner

FAN CONTROLLER

This application claims priority to United Kingdom Patent Application No. GB 2007608.9 filed on May 21, 2020 and entitled "FAN CONTROLLER." The entire content of this application is incorporated herein by reference.

The present invention concerns a fan controller and, in particular, the control of a cooling fan in a modular power supply unit (PSU).

It is desirable to be able to adjust the speed of the cooling fan in a power supply to take into account variation loading or changes in ambient temperature. Keeping the fan speed low when possible allows audible noise from the fan to be minimised, whilst also maximising the lifespan of the fan's bearing. Conversely, when the power supply is under a heavy load or exposed to high ambient temperatures, it is advantageous to be able to increase the fan speed to improve cooling and thereby enhance the reliability of the electronic components in the power supply.

U.S. Pat. No. 7,256,562 B2 discloses a fan control circuit for a cooling fan which is able to adjust the input power driving a cooling fan based on detected ambient temperature. However, this type of cooling fan control circuit suffers from a problem in that it takes no account of the thermal stress on components caused by changes in the load on the PSU. The fan speed therefore has to be set fast enough to cater for the worst case load configuration. As such, in most cases, the power supply fan is noisier and is subjected to more wear than it needs to be.

U.S. Pat. No. 5,019,717 discloses an alternative fan control circuit which incorporates additional measurement points in the PSU. This works well for a single output PSU since the temperature of components one side of the isolation barrier is easily estimated from that of those on the other side. This is because all the power delivered by the one output has to be supplied via the one input, and the temperature of an individual component is determined by a combination of the electrical loading on that component and the ambient temperature. However, in this type of arrangement, all the temperature sensors have to be located on the same side of the isolation barrier as the fan controller. For example, in U.S. Pat. No. 5,019,717 they are all located on the primary side. As such, this type of arrangement does not work with multiple isolated outputs, and hence is unsuitable for use in a modular PSU. That is, uneven loading on different outputs means that one module could run hot while the rest of the PSU runs cool.

To attempt to address this issue, U.S. Pat. No. 8,387,890 discloses the use of multiple sensors for detecting how hot the output is for each module. This system uses a microprocessor to calculate optimum fan speeds based on multiple temperature sensors, which are connected directly to the processor on the output side of the PSU. However, commercially sold modular PSUs are required to have safety isolation between the primary and secondary (mains input and low voltage output sides), as well as galvanic isolation between each module output. Consequently, circuit arrangements of the type disclosed in U.S. Pat. No. 8,387,890 aren't practical in a commercial context because primary related temperature sensors cannot be attached to each module, and multiple sensors cannot be wired to a single low voltage controller.

Accordingly, controlling the speed of a cooling fan in a modular power supply to optimise system noise or fan wear-out remains an issue. Existing fan control methods either do not allow monitoring of the temperature of individual modules across an isolation barrier, or require bigger and more expensive components than can be reasonably accommodated in a compact power supply module. There is therefore a need for an improved fan controller which addresses the above problems.

According to a first aspect of the present invention there is provided a fan controller for a modular power supply having a fan, the fan controller comprising: an output for transmitting control signals to the fan for controlling fan speed; and a plurality of sensor modules each for association with a respective module of the modular power supply, wherein each sensor module comprises: a temperature detecting circuit comprising a sensor for sensing temperature variations in the respective module; a fan control circuit galvanically isolated from the temperature detecting circuit for outputting a control signal to the output for controlling the fan; and an optocoupler for transferring an output signal from the temperature sensing circuit to the fan control circuit for generating the control signal.

In this way, the optocoupler provides an isolation barrier between each sensor module's temperature detecting circuit and control circuit. The temperature detecting circuit may therefore be located on the primary (mains input side) and the control circuit may be located on the secondary (low voltage output side), for providing isolation between the two. At the same time, a plurality of sensor modules may be provided for independently sensing the temperature within different PSU modules, with those modules being galvanically isolated from one another on the temperature detecting circuit side. Moreover, on the control circuit side, the plurality of fan control circuits may connect to a single common output for controlling the fan. Therefore, the detection of a temperature increase within any one or more of the PSU modules may cause an increase in fan speed. Accordingly, only one standard low-speed optocoupler is required for providing temperature feedback, and hence control may be implemented with the minimum size, complexity and number of components on each module.

In this connection, the present inventors contemplated alternative solutions in which each temperature reading was digitised, and a digital isolator or high-speed optocoupler was used to transmit the information across the isolation barrier to a microprocessor. However, such components are significantly larger than low speed optocouplers. For example, a typical digital isolator may occupy an area of 10.3 mm×10.3 mm, compared with the 4.1 mm×10.2 mm for a low speed optocoupler. In addition to this, space has to be found on each module for an analogue to digital converter and microprocessor to digitise and transmit the temperature reading across the isolator. Finally, digital isolators are expensive components (e.g. £1.50 each, compared to around £0.11 for a low speed optocoupler), and significantly add to the component cost of each module.

In embodiments, the temperature detecting circuit comprises an operational amplifier for generating the output signal. In this way, the high gain of the operational amplifier may be used to generate an output signals from a small difference in voltage output by the temperature sensor. A low speed optocoupler may be used. The arrangement allows a small general purpose surface mount op-amp to be used, which, at around £0.035 a unit, allows for an inexpensive construction.

In embodiments, the operational amplifier is configured as a bridge. In this way, the need to provide the temperature sensor with a stable reference voltage is avoided.

In embodiments, the operational amplifier comprises negative feedback. In this way, improved stability is provided.

In embodiments, the temperature detecting circuit has a set-point corresponding to an activation temperature and generates the output signal when the temperature sensed by the sensor exceeds the activation temperature. In this way, the fan may be switched to a high speed setting as soon as it is detected that the components within the respective module have exceeded a predetermined activation temperature. This thereby allows for a simple implementation.

In this connection, the present inventors contemplated an alternative solution in which each temperature was transmitted as an analogue level via the optocoupler. However, this presents issues as optocouplers have significant non-linearity, along with a gain (CTR) tolerance that at best varies 2:1, and at worst could vary 6:1. Most of the tolerance is due to variation in the emissivity of the optocoupler LED. This may be addressed by including an extra detector on the input side, so feedback can be used to compensate for the non-linearity and gain variation. However, similar to digital isolators, these are larger devices and using this type of optocoupler the fan control scheme would require a separate input for each module and temperature sensor used.

In embodiments, the sensor is a thermistor.

In embodiments, the optocoupler comprises a light-emitting component connected to the temperature detecting circuit and a light detecting component connected to the fan control circuit.

In embodiments, the light-emitting component is a light-emitting diode.

In embodiments, the light detecting component is a photodiode or a phototransistor.

In embodiments, the fan control circuits of the plurality of sensor modules are connected to the output in a wired OR-arrangement. In this way, the fan only requires a single input, and any one or more of the sensor modules may trigger an increase in fan speed.

In embodiments, in use, the output transmits the sum of the control signals from the plurality of sensor modules to the fan for controlling fan speed. In this way, if two or more of the sensor modules are activated at the same time, they may simultaneously control the fan to further increase fan speed. As such, the fan's speed may further increase as more modules exceed their activation temperature.

In embodiments, the output comprises a digital filter for filtering the control signals transmitted to the fan. In this way, the control loop may be stabilised.

In embodiments, the digital filter has a pole at 0.01 Hz. This has been found to provide improved stabilisation of the control loop.

In embodiments, the output comprises a low pass filter for filtering the control signals transmitted to the fan. In this way, system noise can be removed from the control signal.

According to a second aspect of the present invention there is provided a power supply comprising: a plurality of modules; a fan for cooling the plurality of modules, the fan having an input for receiving a control signal for controlling the fan's speed; and plurality of sensor modules associated with a respective module of the modular power supply, wherein each sensor module comprises: a temperature detecting circuit comprising a sensor for sensing temperature variations in the respective module; a fan control circuit galvanically isolated from the temperature detecting circuit for outputting a control signal to the fan's input for controlling the fan; and an optocoupler for transferring an output signal from the temperature detecting circuit to the fan control circuit for generating the control signal.

Illustrative embodiments of the present invention will now be described with reference to the accompanying drawings in which:

FIG. 1 shows a circuit diagram for a fan controller 1 according to an embodiment of the present invention.

Figure 1:
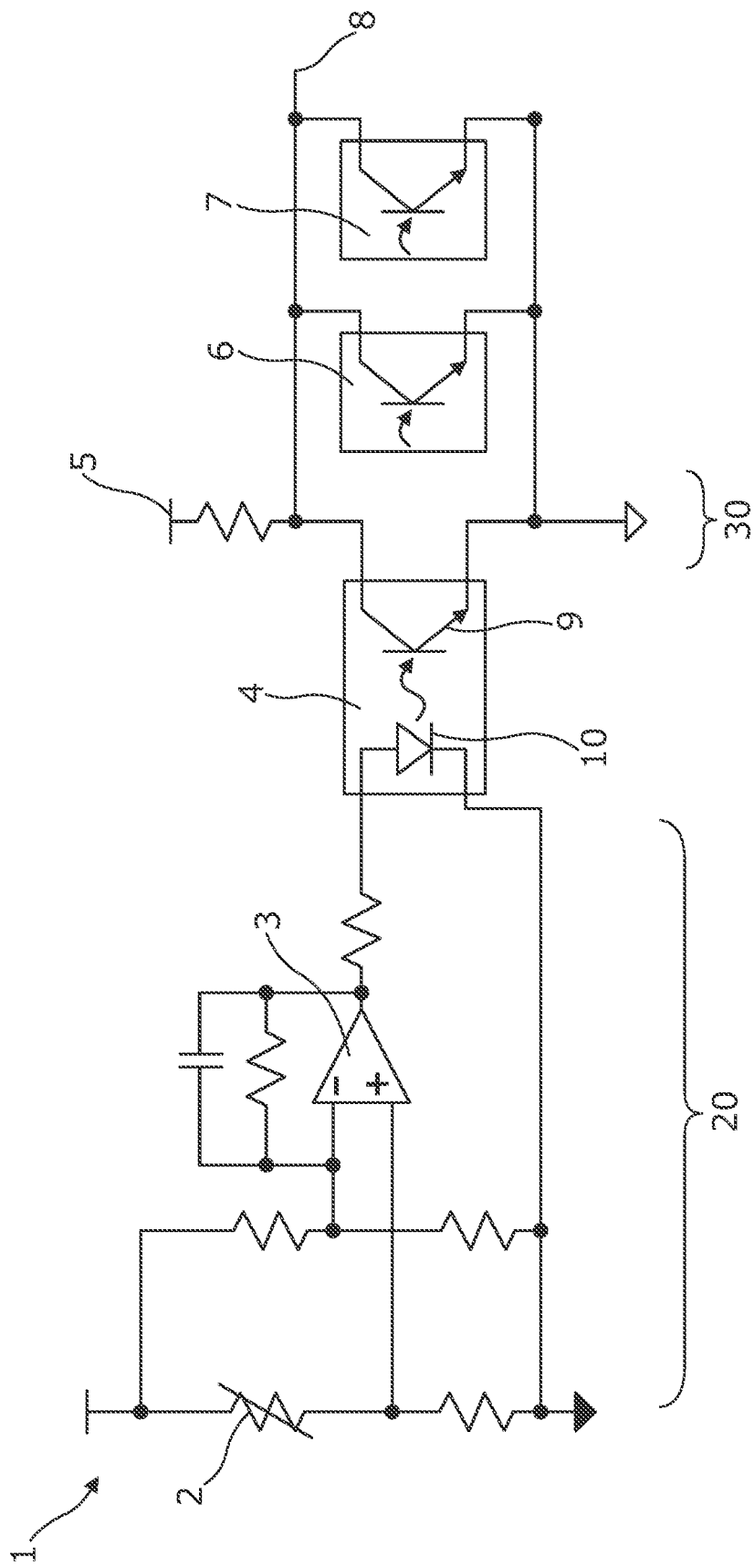
FIG. 1 shows a circuit diagram for an embodiment of the present invention.

The fan controller 1 comprises a temperature sensor 2 which is located close to a hotspot on a first module of a modular power supply for sensing its operating temperature. In this embodiment, the temperature sensor 2 is an NTC negative temperature coefficient (NTC) thermistor, although other temperature sensors, such as a positive temperature coefficient (PTC) thermistors may be used.

The temperature sensor 2 is connected to the non-inverting input of the operational amplifier (op-amp) 3. As the temperature sensed by NTC temperature sensor 2 increases, its resistance decreases, thereby increasing the voltage applied to the non-inverting input of op-amp 3.

The op-amp 3 is provided with a negative feedback loop connecting a resistor and capacitor in parallel between the op-amp's output and its inverting input. The input of the op-amp is configured as a bridge, which thereby avoids the need for a stable reference voltage to supply the temperature sensor 2. The op-amp 3 is configured to have a predetermined set-point which corresponds to an activation temperature sensed by the temperature sensor 2. That is, when the temperature sensor 2 is exposed to a temperature above the activation temperature, the voltage applied to the non-inverting input increases above a threshold, triggering the op-amp 3 to generate an output signal. The op-amp 3 and temperature sensor 2 thereby forms a sensing circuit 20 which activates once the set-point is reached.

The output of op-amp 3 is connected to an optocoupler 4 for transmitting signals across an isolation barrier from the sensing circuit 20 to a control circuit 30 connected to the fan (not shown). In particular, the op-amp's output connects to a light-emitting diode (LED) 10 of the optocoupler 4 which emits a light signal when the output signal is generated by op-amp 3. On the control circuit 30 side of the optocoupler, a phototransistor 9 receives the light signals emitted by the LED 10, and in turn generates a control signal in the output 8 in response thereto. Output 8 is connected to the control terminal of the fan and the application of the generated control signal causes the fan speed to increase.

FIG. 1 further shows the phototransistors of a second 6 and third optocoupler 7 which are associated with second and third modules of the modular power supply, respectively. As such, each optocoupler has its own temperature sensor and op-amp which form part of sensing module associated with each respective power supply module. The phototransistors of the second 6 and third optocoupler are connected, along with the phototransistor 9 of the first optocoupler 4, to the output 8 in a wired-OR arrangement. As such, in use, if any modules' temperature sensors 2 exceed their activation temperature, a control signal will be generated by the respective optocoupler 4, 6, 7 in the output 8, thereby controlling the fan to increase fan speed. As such, the fan 13 may be controlled by any one of the sensor modules through only one input 8. It will be understood that different modules may be configured to have different set points in order to optimise the temperature at which they activate the fan depending on, for example, the temperature sensitivity of the components within that module.

Figure 2:
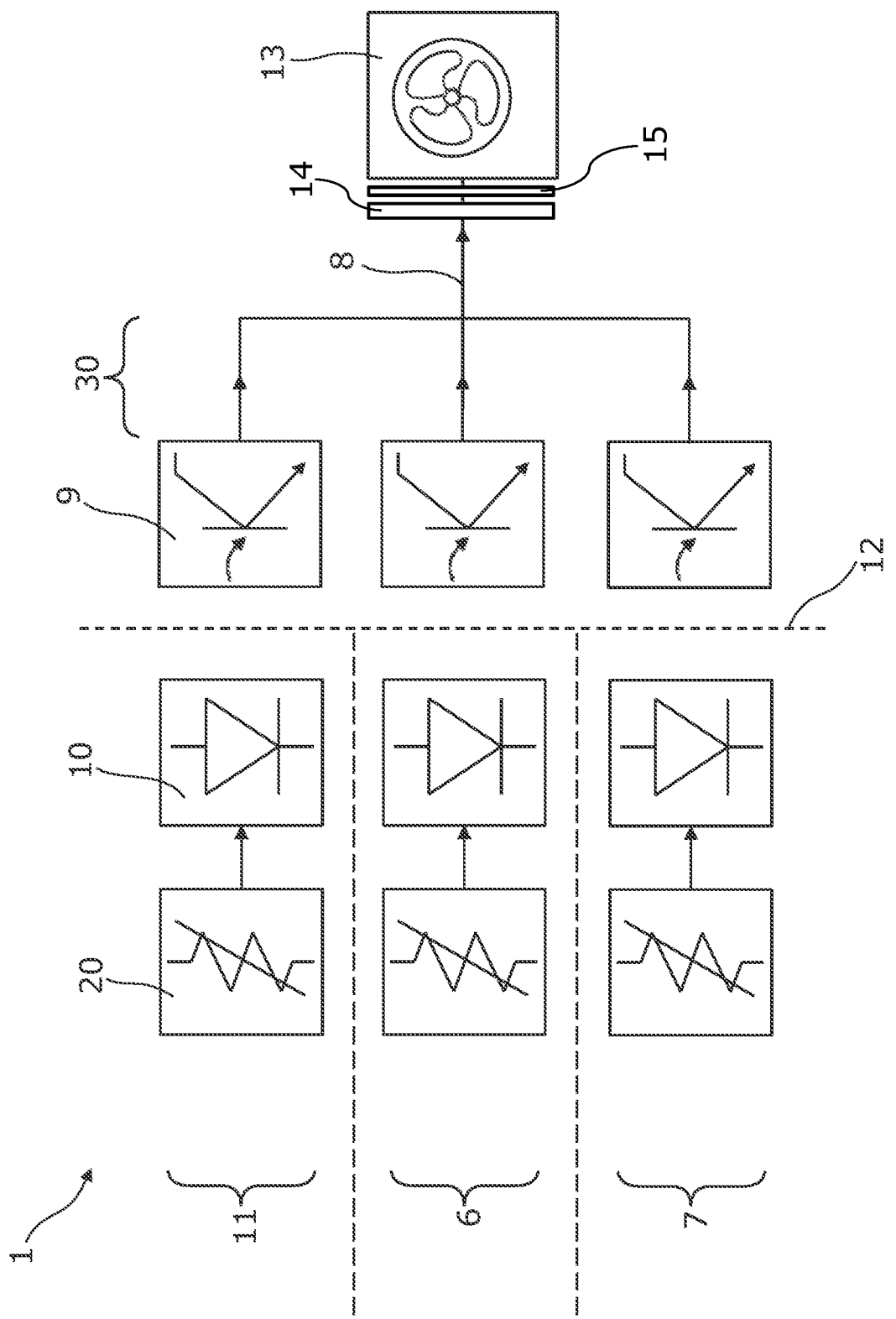
FIG. 2 shows a schematic diagram of the embodiment shown in FIG. 1.

FIG. 2 shows a schematic diagram of the embodiment shown in FIG. 1. As shown, the controller 1 is provided with three sensing modules 11, 6, 7 which are associated with different modules of the modular power supply. The temperature detecting circuits 20 of each module 11, 6, 7 are galvanically isolated from one another. At the same time, the LEDs 10 and the phototransistors 9 of the modules 11, 6, 7 form an isolation barrier 12 between each module's temperature detecting circuit 20 and control circuit 30. The control circuits 30 are connected to a common output 8 which allows any one or more of the modules 11, 6, 7 to control the speed of fan 13. In use, the fan 13 may be configured to operate at a low speed setting by default. If the temperature in any of the sensing modules 11, 6, 7 then reaches its activation temperature, a control signal will be generated in the output 8 to activate a higher speed setting on the fan 13.

In embodiments, the fan speed may increase with the magnitude of the current applied through output 8. For example, the fan 13 may be controlled so that its speed is proportional to the sum of the received one or more control signals; as further modules reach their activation temperature, the fan speed may therefore increase further.

Accordingly, with embodiments of the present invention, the controller does not attempt to determine how hot the individual modules are, but instead identifies that one or more of the modules have reached their respective activation temperatures determined by the set-point of their control loops. This thereby provides for a small, cheap and simple fan controller, in which only one inexpensive, low-speed optocoupler is required per module. The wired-OR arrangement also means that a number of modules may be connected, limited only by the leakage current of whichever type of optocoupler is used.

In some embodiments, a slow digital filter 14 may additionally be provided at the output 8 for stabilising the feedback control loop. For example, a digital filter 14 may be provided in the microprocessor used for fan control to create a pole at 0.01 Hz. A low pass filter 15 may also be provided to remove noise in the system. This may help to mitigate any control instability arising from the thermal mass and time-constant of each module.

It will be understood that the embodiment illustrated above shows applications of the invention only for the purposes of illustration. In practice the invention may be applied to many different configurations, the detailed embodiments being straightforward for those skilled in the art to implement.

For example, although the above embodiment describes the invention in the context of a modular PSU with three modules, it will be understood that the invention may be applied to PSU's with different numbers of modules. For example, two or more sensing modules may be provided. Furthermore, more than one sensing module may be associated with a single PSU module to provide temperature sensing at two locations within the same module.

Furthermore, embodiments providing some additional analogue control over the fan speed may also be implemented. For example, the optocoupler may be provided with an analogue response such that, when the output of the op-amp increases with increasing temperature, the intensity of the signal transmitted by the optocoupler may also increase. This may then cause the control signal current to increase, thereby increasing the fan speed. In embodiments, the op-amp may be configured such that the varying output signal is only generated above the set-point, once the activation temperature has been exceeded.

The invention claimed is:

1. A fan controller for a modular power supply having a mains input side, a low voltage output side comprising a plurality of galvanically isolated output modules, and a fan, the fan controller comprising:
   an output for transmitting control signals to the fan for controlling fan speed; and
   a plurality of sensor modules each sensor module associated with a respective one of the plurality of output modules of the modular power supply, wherein each sensor module comprises:
      a temperature detecting circuit comprising a sensor for sensing temperature variations in the respective module;
      a fan control circuit galvanically isolated from the temperature detecting circuit for outputting a control signal to the output for controlling the fan; and
      an optocoupler for transferring an output signal from the temperature detecting circuit to the fan control circuit for generating the control signal.

2. The fan controller according to claim 1, wherein the temperature detecting circuit comprises an operational amplifier for generating the output signal.

3. The fan controller according to claim 2, wherein the operational amplifier is configured as a bridge.

4. The fan controller according to claim 2, wherein the operational amplifier comprises negative feedback.

5. The fan controller according to claim 1, wherein the temperature detecting circuit has a set-point corresponding to an activation temperature and generates the output signal when the temperature sensed by the sensor exceeds the activation temperature.

6. The fan controller according to claim 1, wherein the sensor is a thermistor.

7. The fan controller according to claim 1, wherein the optocoupler comprises a light-emitting component connected to the temperature detecting circuit and a light detecting component connected to the fan control circuit.

8. The fan controller according to claim 7, wherein the light-emitting component is a light-emitting diode.

9. The fan controller according to claim 7, wherein the light detecting component is a photodiode or a phototransistor.

10. The fan controller according to claim 1, wherein the fan control circuits of the plurality of sensor modules are connected to the output in a wired OR arrangement.

11. The fan controller according to claim 1, wherein, in use, the output transmits the sum of the control signals from the plurality of sensor modules to the fan for controlling fan speed.

12. The fan controller according to claim 1, wherein the output comprises a digital filter for filtering the control signals transmitted to the fan.

13. The fan controller according to claim 12, wherein the digital filter has a pole at 0.01 Hz.

14. The fan controller according to claim 1, wherein the output comprises a low pass filter for filtering the control signals transmitted to the fan.

15. A power supply comprising:
   a mains input side;
   a low voltage output side comprising a plurality of output modules;
   a fan for cooling the plurality of modules, the fan having an input for receiving a control signal for controlling the fan's speed; and
   a plurality of sensor modules, each sensor module associated with a respective output module of the plurality of output modules of the modular power supply, wherein each sensor module comprises:
- a temperature detecting circuit comprising a sensor for sensing temperature variations in the respective module;
- a fan control circuit galvanically isolated from the temperature detecting circuit for outputting a control signal to the fan's input for controlling the fan; and an optocoupler for transferring an output signal from the temperature detecting circuit to the fan control circuit for generating the control signal.

\* \* \* \* \*